(12) United States Patent
Damodaran Prabha et al.

(10) Patent No.: US 11,728,643 B2
(45) Date of Patent: Aug. 15, 2023

(54) LEVEL SENSING SHUT-OFF FOR A RATE-TRIGGERED ELECTROSTATIC DISCHARGE PROTECTION CIRCUIT

(71) Applicant: TEXAS INSTRUMENTS INCORPORATED, Dallas, TX (US)

(72) Inventors: Rajiv Damodaran Prabha, Nashua, NH (US); Vishwanath Joshi, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 50 days.

(21) Appl. No.: 17/491,417

(22) Filed: Sep. 30, 2021

(65) Prior Publication Data

US 2023/0093961 A1    Mar. 30, 2023

(51) Int. Cl.
*H02H 9/04* (2006.01)
*H01L 27/02* (2006.01)
*H01L 29/866* (2006.01)

(52) U.S. Cl.
CPC ......... *H02H 9/046* (2013.01); *H01L 27/0266* (2013.01); *H01L 29/866* (2013.01)

(58) Field of Classification Search
CPC .... H02H 9/046; H01L 27/0266; H01L 29/866
USPC .......................................................... 361/56
See application file for complete search history.

(56) References Cited

U.S. PATENT DOCUMENTS

| | | | |
|---|---|---|---|
| 10,546,619 B2* | 1/2020 | Lai | G11C 16/24 |
| 2005/0134295 A1 | 6/2005 | Blumenthal | |
| 2006/0176626 A1 | 8/2006 | Greisbach et al. | |
| 2007/0183104 A1* | 8/2007 | Tseng | H01L 27/0285 361/56 |
| 2008/0239599 A1 | 10/2008 | Yizraeli et al. | |
| 2013/0335868 A1* | 12/2013 | Lamar | H02H 9/046 361/56 |

FOREIGN PATENT DOCUMENTS

EP    0915551 A2    5/1999

OTHER PUBLICATIONS

International PCT Search Report dated Jan. 31, 2023.

\* cited by examiner

*Primary Examiner* — Dharti H Patel
(74) *Attorney, Agent, or Firm* — Charles F. Koch; Frank D. Cimino

(57) ABSTRACT

A device includes a protected terminal, a reference terminal, and a rate-triggered circuit coupled to the protected terminal and to the reference terminal. The rate-triggered circuit is configured to provide an output voltage responsive to a ramp rate of a voltage at the protected terminal being greater than a rate threshold. The device also includes a transistor configured to shunt current from the protected terminal to the reference terminal responsive to the rate-triggered circuit output voltage, and a level-sensing circuit configured to turn off the transistor responsive to the voltage at the protected terminal being greater than a level-sense threshold.

17 Claims, 5 Drawing Sheets

LEVEL SENSING SHUT-OFF FOR A RATE-TRIGGERED ELECTROSTATIC DISCHARGE PROTECTION CIRCUIT

BACKGROUND

Integrated circuits (ICs) can be subjected to electrostatic discharge (ESD) events through contact with a charged body (e.g., a human) that cause high voltages at one or more pins or terminals of the IC, and/or inject high current to the pins or terminals.

SUMMARY

In an example, a device includes a protected pin, a reference pin, and a rate-triggered circuit coupled to the protected pin and to the reference pin. The rate-triggered circuit is configured to provide an output voltage responsive to a ramp rate of a voltage at the protected pin being greater than a rate threshold. The device also includes a transistor configured to shunt current from the protected pin to the reference pin responsive to the rate-triggered circuit output voltage, and a level-sensing circuit configured to turn off the transistor responsive to the voltage at the protected pin being greater than a level-sense threshold.

In another example, a method includes receiving a voltage at a protected pin of a protection circuit, shunting current from the protected pin to a reference pin of the protection circuit responsive to a ramp rate of the voltage being greater than a rate threshold, and blocking current between the protected pin and the reference pin responsive to the voltage being greater than a level-sense threshold.

In yet another example, a device includes a protected pin, a reference pin, and a rate-triggered circuit having an output, and an input coupled to the protected pin. The device also includes a first transistor having a first terminal, a second terminal, and a control terminal. The first transistor first terminal is coupled to the protected pin, the first transistor second terminal is coupled to the reference pin, and the first transistor control terminal is coupled to the rate-triggered circuit output. The device also includes a second transistor having a first terminal, a second terminal, and a control terminal. The second transistor first terminal is coupled to the first transistor control terminal, and the second transistor second terminal is coupled to the reference pin. The device also includes a first resistor having a first terminal and a second terminal. The first resistor first terminal is coupled to the protected pin, and the first resistor second terminal is coupled to a level-sense node. The device also includes a second resistor having a first terminal and a second terminal. The second resistor first terminal is coupled to the level-sense node, and the second resistor second terminal is coupled to the reference pin.

DETAILED DESCRIPTION

Figure 1:
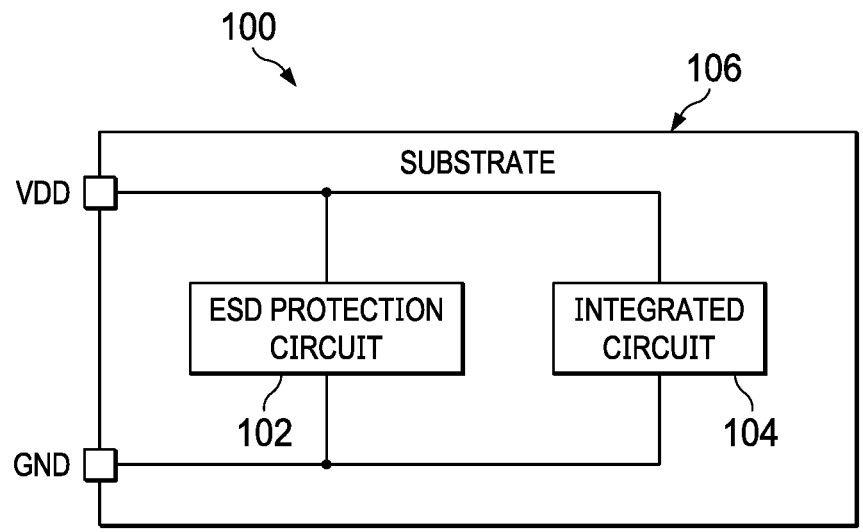
FIG. 1 is a block diagram of a system including a rate-triggered ESD protection circuit in an example.

ESD events can damage an IC through voltage spikes, thermal runaway, and resultant junction shorting, metal fusing opening, and/or dielectric breakdown. These events can cause irreversible physical damage in circuits when the amount of current exceeds the capability of the electrical conduction path through the IC. In some cases, an IC is provided with ESD protection circuits or cells, such as clamp circuits, to shunt ESD current between a protected pin and a reference pin (e.g., a ground terminal). The protected pin can be a voltage supply pin to provide a supply voltage to the IC during normal operation.

In some cases, ESD protection circuits are rate-triggered, in which the ESD protection circuit turns on to shunt current from the protected pin to the reference pin responsive to an input voltage signal (e.g., received at the protected pin) having a ramp rate greater than a rate threshold of the ESD protection circuit. In other cases, ESD protection circuits are level-triggered, in which the ESD protection circuit turns on to shunt current from the protected pin to the reference pin responsive to the input voltage signal having a voltage amplitude greater than a level threshold of the ESD protection circuit. Generally, the internal circuitry on pins protected by rate-triggered ESD protection circuits is exposed to lower voltages during an ESD event than the internal circuitry of pins protected by level-triggered ESD protection circuits, which can be exposed to breakdown-level voltages. Accordingly, circuit components that are protected by rate-triggered ESD protection circuits can be manufactured having lower voltage ratings for a same application, which can be more cost-effective and physically smaller.

A hot plug-in (HP) event is an event in which the protected pin is coupled to a powered (e.g., "hot") cable or connector that is coupled to a power source (e.g., a battery, a mains power supply). HP events can result in an input voltage signal having a ramp rate that approximates an ESD event ramp rate, thus triggering the rate-triggered ESD protection circuit. ESD events are transient in nature (e.g., relatively low-energy) and thus more easily dissipated by the ESD protection circuit. However, the power source that causes an HP event is difficult or impossible to dissipate, and thus can damage the ESD protection circuit, such as transistor(s) of the ESD protection circuit that shunt current from the protected pin to the reference pin. Accordingly, it is useful to prevent false triggering of the ESD protection circuit responsive to an HP event.

Examples of this description address the foregoing by providing a rate-triggered ESD protection circuit that includes level-sensing circuitry. In some examples, for a particular application of the ESD protection circuit, there is a maximum expected voltage on the protected pin responsive to an ESD event, which is a first voltage value. In the particular application, there is an expected voltage on the protected pin responsive to an HP event, which is a second voltage value. As described above, a ramp rate for both the ESD event and the HP event can be similar. However, the ESD event is more quickly dissipated than the HP event because the ESD event has a lower total energy than the HP event. Accordingly, the first voltage value is less than the second voltage value because the ESD protection circuit quickly dissipates the energy from the ESD event before the voltage on the protected pin can increase beyond the first voltage value.

For example, a supply voltage for the IC protected by the ESD protection circuit is 60 volts (V) (e.g., from a battery pack, or other direct current (DC) voltage source). The second voltage value is on the order of 60 V, and the ESD protection circuit cannot dissipate the energy stored in a battery pack or mains power supply. In this same application, the maximum expected voltage on the protected pin responsive to an ESD event is on the order of 12 V.

Examples of this description differentiate between an HP event and an ESD event by providing level-sensing circuitry configured to be coupled to the rate-triggered ESD protection circuit. The rate-triggered ESD protection circuit is configured to turn on (e.g., shunt current from the protected pin to the reference pin) responsive to a voltage received at the protected pin having a ramp rate greater than a rate threshold of the ESD protection circuit. The rate-triggered ESD protection circuit is also configured to turn off responsive to the voltage received at the protected pin exceeding a level-sense threshold. The level-sense threshold is greater than the first voltage level (e.g., the expected voltage responsive to an ESD event). The level-sense threshold is also less than the second voltage level (e.g., the expected voltage responsive to an HP event).

Accordingly, the rate-triggered ESD protection circuit of this description is triggered responsive to an ESD event, but also turns off responsive to an HP event, and thus avoids false triggering responsive to an HP event. The internal components of the described rate-triggered ESD protection circuit are thus protected from damage responsive to the HP event. The internal components of the described rate-triggered ESD protection circuit can also be are smaller and/or lower-cost than components that are designed to tolerate the greater energies of an HP event.

FIG. 1 is a block diagram of a system 100 including a rate-triggered ESD protection circuit 102 in an example. The system 100 also includes an IC 104 that is coupled to the ESD protection circuit 102. In an example, the ESD protection circuit 102 and the IC 104 are implemented on a substrate 106 (e.g., a monolithic semiconductor substrate). In one example, the ESD protection circuit 102 is integrated with the IC 104. In another example, the ESD protection circuit 102 is a separate component from the IC 104 on the substrate 106. The ESD protection circuit 102 and the IC 104 are coupled to a protected pin VDD (VDD is also used to refer to a voltage at the protected pin, for simplicity) and to a reference pin GND, which can be a ground terminal at a voltage of 0 volts (V) in an example. As described above, the protected pin VDD can be a voltage supply pin to provide a supply voltage VDD to the IC 104 during normal operation. Accordingly, a protected pin of the ESD protection circuit 102 is adapted to be coupled to a voltage supply pin of the IC 104.

Figure 2:
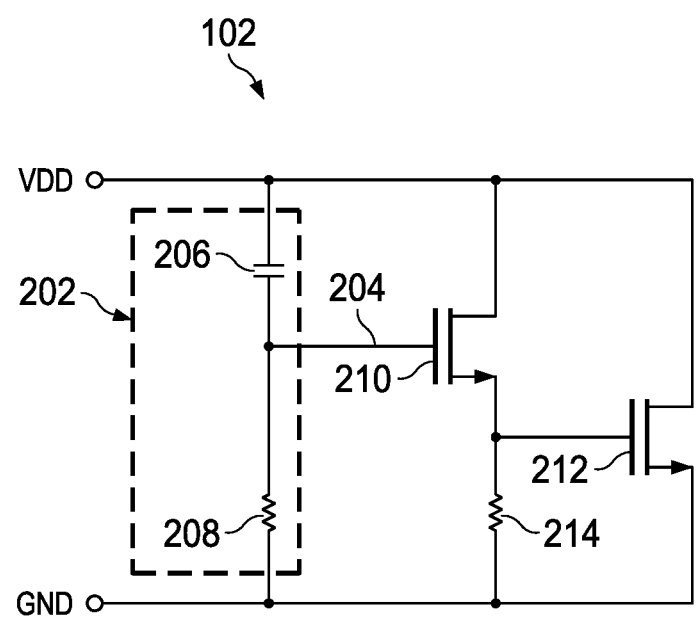
FIG. 2 is a circuit schematic diagram of a rate-triggered ESD protection circuit in an example.

FIG. 2 is a circuit schematic diagram of the rate-triggered ESD protection circuit 102 in an example. The rate-triggered ESD protection circuit 102 includes a high-pass filter 202, which is coupled to the protected pin VDD and to the reference pin GND. The protected pin VDD is an input to the high-pass filter 202. The high-pass filter 202 is configured to provide a voltage at its output 204 responsive to a voltage at its input (VDD) having a ramp rate that is greater than a rate threshold of the high-pass filter 202. For example, the high-pass filter 202 includes a capacitor 206 that has a first terminal coupled to the protected pin VDD. The high-pass filter 202 also includes a resistor 208 that has a first terminal coupled to a second terminal of the capacitor 206, and has a second terminal coupled to the reference pin GND. The values of the capacitor 206 and the resistor 208 can be selected so that the high-pass filter 202 provides or "passes" a voltage to its output 204 responsive to VDD having a ramp rate greater than a rate threshold. The output 204 of the high-pass filter 202 is relatively low (e.g., near GND) responsive to the ramp rate being less than the rate threshold. The output 204 of the high-pass filter 202 is relatively high (e.g., near VDD) responsive to the ramp rate being greater than the rate threshold. For example, the rate threshold is determined responsive to an expected ramp rate of an ESD event (e.g., for an application of the ESD protection circuit 102).

In the example of FIG. 2, the ESD protection circuit 102 includes a buffer transistor 210 that is configured to drive the gate of a power transistor 212 responsive to the output 204 of the high-pass filter 202. The buffer transistor 210 has a first terminal coupled to the protected pin VDD, and has a second terminal coupled to the gate of the power transistor 212. A control terminal of the buffer transistor 210 is coupled to the output 204 of the high-pass filter 202. In an example, the buffer transistor 210 is an n-type metal—oxide—semiconductor, field-effect (nMOS) transistor 210. In this example, the buffer transistor 210 first terminal is a drain, second terminal is a source, and control terminal is a gate. The buffer transistor 210 turns on responsive to its gate voltage being greater than a threshold voltage of the buffer transistor 210. In some cases, the source of the buffer transistor 210 (and thus the gate of the power transistor 212) is coupled to a resistor 214, which is also coupled to the reference pin GND. The resistor 214 pulls the gate of the power transistor 212 to GND responsive to the buffer transistor 210 being off.

The power transistor 212 is configured to shunt current (e.g., ESD current) from the protected pin VDD to the reference pin GND. The power transistor 212 has a first terminal coupled to the protected pin VDD, and has a second terminal coupled to the reference pin GND. A control terminal of the power transistor 212 is controlled responsive to the output 204 of the high-pass filter 202. For example, the power transistor 212 is on, and thus shunts current from the protected pin VDD to the reference pin GND, responsive to VDD having a ramp rate greater than the rate threshold, described above. In an example, the power transistor 212 is an nMOS transistor 212. In this example, the power transistor 212 first terminal is a drain, second terminal is a source, and control terminal is a gate. The power transistor 212 turns on responsive to its gate voltage being greater than a threshold voltage of the power transistor 212.

Figure 3:
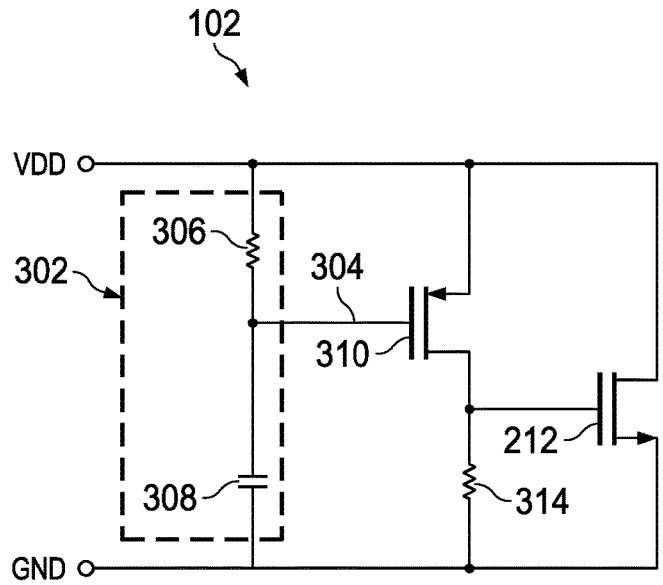
FIG. 3 is a circuit schematic diagram of another rate-triggered ESD protection circuit in an example.

FIG. 3 is a circuit schematic diagram of the rate-triggered ESD protection circuit 102 in another example. The rate-triggered ESD protection circuit 102 in FIG. 3 is similar to that shown in FIG. 2, except that the high-pass filter 202 is replaced with a low-pass filter 302 (having an output 304), in which the arrangement of the resistor and capacitor is reversed. For example, the low-pass filter 302 includes a resistor 306 that has a first terminal coupled to the protected pin VDD. The low-pass filter 302 also includes a capacitor 308 that has a first terminal coupled to a second terminal of the resistor 306, and has a second terminal coupled to the reference pin GND. The values of the resistor 306 and the capacitor 308 can be selected so that the low-pass filter 302 provides or "passes" a voltage (e.g., VDD minus the voltage across resistor 306) to its output 304 responsive to VDD having a ramp rate less than a rate threshold. The low-pass filter 302 is effectively a reciprocal device compared to the high-pass filter 202, and the output 304 of the low-pass filter 302 is relatively high (e.g., near VDD) responsive to the ramp rate being less than the rate threshold. The output 304 of the low-pass filter 302 is relatively low (e.g., near GND) responsive to the ramp rate being greater than the rate threshold. For example, the rate threshold is determined responsive to an expected ramp rate of an ESD event (e.g., for an application of the ESD protection circuit 102).

In the example of FIG. 3, the nMOS buffer transistor 210 in FIG. 2 is replaced with a p-type metal—oxide—semiconductor, field-effect (pMOS) buffer transistor 310, which is configured to drive the gate of the power transistor 212 responsive to the output 304 of the high-pass filter 302. The buffer transistor 310 has a first terminal coupled to the protected pin VDD, and has a second terminal coupled to the gate of the power transistor 212. A control terminal of the buffer transistor 310 is coupled to the output 304 of the high-pass filter 302. In this example, the buffer transistor 310 first terminal is a source, second terminal is a drain, and control terminal is a gate. The buffer transistor 310 turns on responsive to the magnitude of its gate voltage with respect to its source voltage being greater than a threshold voltage of the buffer transistor 310. In some cases, the drain of the buffer transistor 310 (and thus the gate of the power transistor 212) is coupled to a resistor 314, which is also coupled to the reference pin GND. The resistor 314 pulls the gate of the power transistor 212 to GND responsive to the buffer transistor 310 being off. The power transistor 212 is arranged and functions as described above with respect to FIG. 2.

Figure 4:
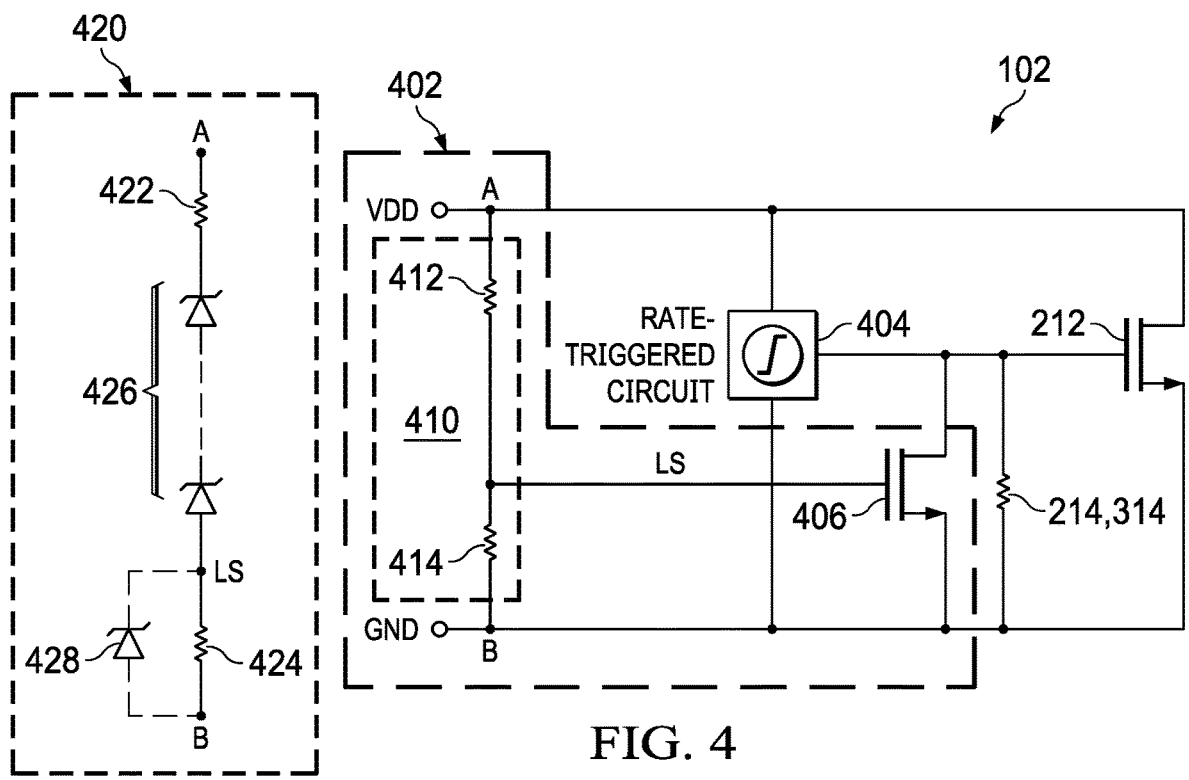
FIG. 4 is a circuit schematic diagram of a level-sensing shut-off circuit for a rate-triggered ESD protection circuit in an example.

FIG. 4 is a circuit schematic diagram of a level-sensing circuit 402 for a rate-triggered ESD protection circuit 102 in an example. For simplicity of description, the rate-triggered ESD protection circuit 102 is separated into a rate-triggered circuit 404 and the power transistor 212. The rate-triggered circuit 404 represents the high-pass filter 202 and the optional buffer transistor 210 of FIG. 2, or the low-pass filter 302 and the optional buffer transistor 310 of FIG. 3. Accordingly, the rate-triggered circuit 404 is configured to drive the gate of the power transistor 212 to cause the power transistor 212 to turn on responsive to VDD having a ramp rate greater than the rate threshold. The power transistor 212 is thus configured to shunt current from the protected pin VDD to the reference pin GND responsive to VDD having a ramp rate greater than the rate threshold (e.g., implemented by the high- or low-pass filter 202, 302, respectively).

The level-sensing circuit 402 is coupled to the protected pin VDD and to the reference pin GND. The level-sensing circuit 402 includes a pull-down transistor 406 that is configured to pull the gate of the power transistor 212 to GND responsive to VDD being greater than a level-sense threshold. The power transistor 212 turns off responsive to its gate being pulled to GND, which blocks current from flowing from the protected pin VDD to the reference pin GND. The pull-down transistor 406 has a first terminal coupled to the gate of the power transistor 212, and has a second terminal coupled to the reference pin GND. A control terminal of the pull-down transistor 406 is coupled to a level sense node LS (for simplicity, LS can refer to a voltage at the level sense node). In an example, the pull-down transistor 406 is an nMOS transistor 406. In this example, the pull-down transistor 406 first terminal is a drain, second terminal is a source, and control terminal is a gate. The pull-down transistor 406 turns on responsive to its gate voltage (e.g., LS) being greater than a threshold voltage of the pull-down transistor 406.

In one example, the level-sensing circuit 202 includes a resistive voltage divider 410 to provide a voltage at the LS node sufficient to turn on the pull-down transistor 406 responsive to VDD being greater than the level-sense threshold. For example, the resistive voltage divider 410 includes a resistor 412 that is coupled to VDD (also shown as node A) and to LS, and a resistor 414 that is coupled to LS and to GND (also shown as node B).

In another example, the level-sensing circuit 202 includes voltage divider 420, which has a Zener diode (or diode stack) coupled in series with a resistive voltage divider. For example, the voltage divider 420 includes a resistor 422 that is coupled to VDD or node A, and a resistor 424 that is coupled to LS and to GND or node B. In addition, one or more Zener diodes 426 (e.g., a Zener diode stack 426) is coupled to the resistor 422 and to LS. Cathode(s) of the Zener diode(s) 426 face the resistor 422, while anode(s) of the Zener diode(s) 426 face the node LS. In one example, an additional Zener diode 428 is arranged in parallel with the resistor 424.

In the purely resistive voltage divider 410 example, the voltage at LS increases proportionally with the voltage at VDD. Accordingly, while the resistor 412, 414 values and the pull-down transistor 406 threshold voltage can be designed for a particular application (e.g., to implement a particular level-sense threshold at which the pull-down transistor 406 turns on), the pull-down transistor 406 can be partially on as VDD rises, but while VDD is still below the level-sense threshold. The Zener diode stack 426 of the voltage divider 420 functions to block VDD from LS until VDD exceeds a sum of the breakdown voltages of the Zener diode stack 426, which can be designed to be approximately the level-sense threshold, at which point the resistors 422, 424 function as a voltage divider and the voltage at LS turns on the pull-down transistor 406. In examples in which the Zener diode 428 is present, the Zener diode 428 is configured to clamp or otherwise limit the voltage at LS to a level that does not damage the pull-down transistor 406.

In a first example of operation of the ESD protection circuit 102, an ESD event occurs on the protected pin VDD. A ramp rate of VDD responsive to the ESD event is greater than a rate threshold implemented by the rate-triggered circuit 404, which is based on values of the capacitor 206, 308 and the resistor 208, 306. The rate-triggered circuit 404 drives the gate of the power transistor 212 to cause the power transistor 212 to turn on responsive to the ramp rate of VDD being greater than the rate threshold. The power transistor 212 thus shunts current from VDD to GND, dissipating the ESD event and protecting the IC 104 from the ESD.

In this first example of operation, a maximum expected voltage at VDD responsive to the ESD event is on the order of 12 V. However, the level-sense threshold implemented by the level-sensing circuit 402 is greater than 12 V (e.g., 20 V). Accordingly, the voltage at LS is not sufficient to turn on the pull-down transistor 406, and thus the level-sensing circuit 402 is not triggered.

In a second example of operation of the ESD protection circuit 102, an HP event occurs on the protected pin VDD. A ramp rate of VDD responsive to the HP event is also greater than the rate threshold implemented by the rate-triggered circuit 404. The rate-triggered circuit 404 drives the gate of the power transistor 212 to cause the power transistor 212 to turn on responsive to the ramp rate of VDD being greater than the rate threshold. The power transistor 212 thus begins to shunt current from VDD to GND.

However, in this second example of operation, an expected voltage at VDD responsive to the HP event is higher than for an ESD event, such as on the order of 60 V (e.g., provided by a battery pack or other power supply). As described above, the level-sense threshold implemented by the level-sensing circuit 402 is approximately 20 V in this example. Accordingly, the voltage at LS is sufficient to turn on the pull-down transistor 406 (e.g., the level-sensing circuit 402 is triggered), which pulls the gate of the power transistor 212 to ground, causing the power transistor 212 to turn off.

Accordingly, the rate-triggered ESD protection circuit 102 is triggered responsive to an ESD event, but also turns off responsive to an HP event, and thus avoids false triggering responsive to an HP event. The internal components of the ESD protection circuit 102 (e.g., power transistor 212) are thus protected from damage responsive to the HP event.

Figure 5A:
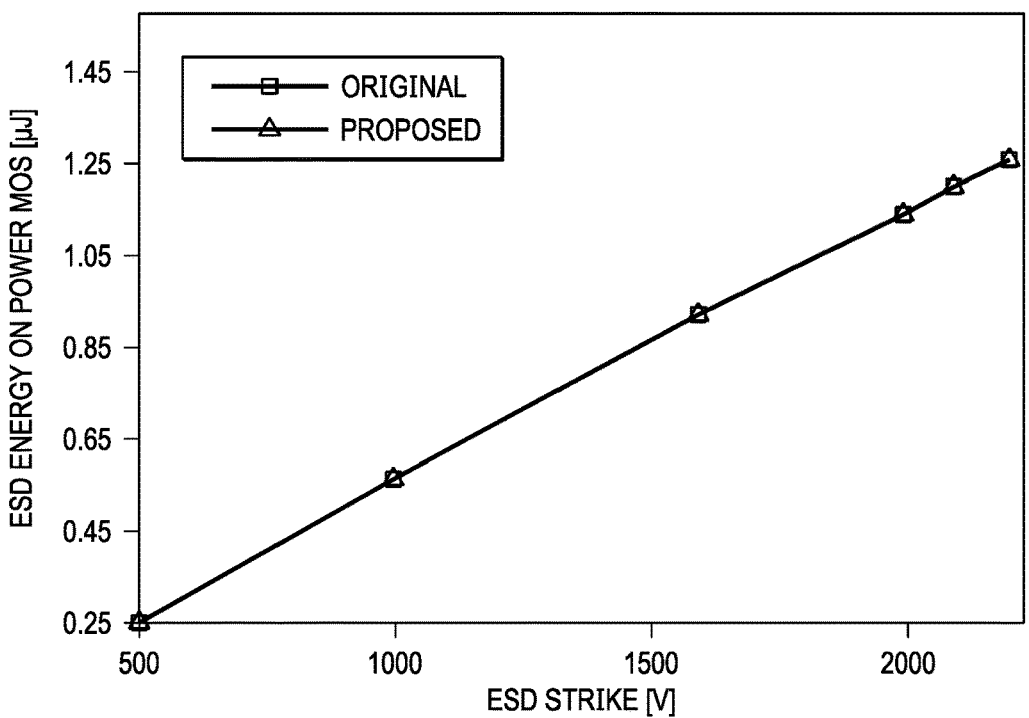
FIG. 5a is a graph of energies dissipated by a power transistor of an ESD protection circuit, for various ESD protection circuit topologies including the rate-triggered ESD protection circuit of FIG. 4, and as a function of ESD event voltage, in an example.

FIG. 5a is a graph 500 of energies dissipated by a power transistor of an ESD protection circuit, such as the power transistor 212 described above, as a function of ESD event or strike voltage. The graph 500 includes a first plot labeled "original," which is for a first ESD protection circuit topology, including the ESD protection circuit 102, such as that shown in FIG. 2 or FIG. 3. The graph 500 includes a second plot labeled "proposed," which is for a second ESD protection circuit topology (also including the ESD protection circuit 102), including the level-sensing circuit 402, such as shown in FIG. 4. The graph 500 demonstrates that the examples of this description, which include the level-sensing circuit 402, provide similar performance (e.g., energy dissipated by the power transistor 212) responsive to various ESD strike voltages when compared to ESD protection circuits 102 that do not include such level-sensing circuit 402. Accordingly, the examples described herein that include the level-sensing circuit 402 provide similar protection against ESD events as compared to ESD protection circuits 102 without the level-sensing circuit 402.

Figure 5B:
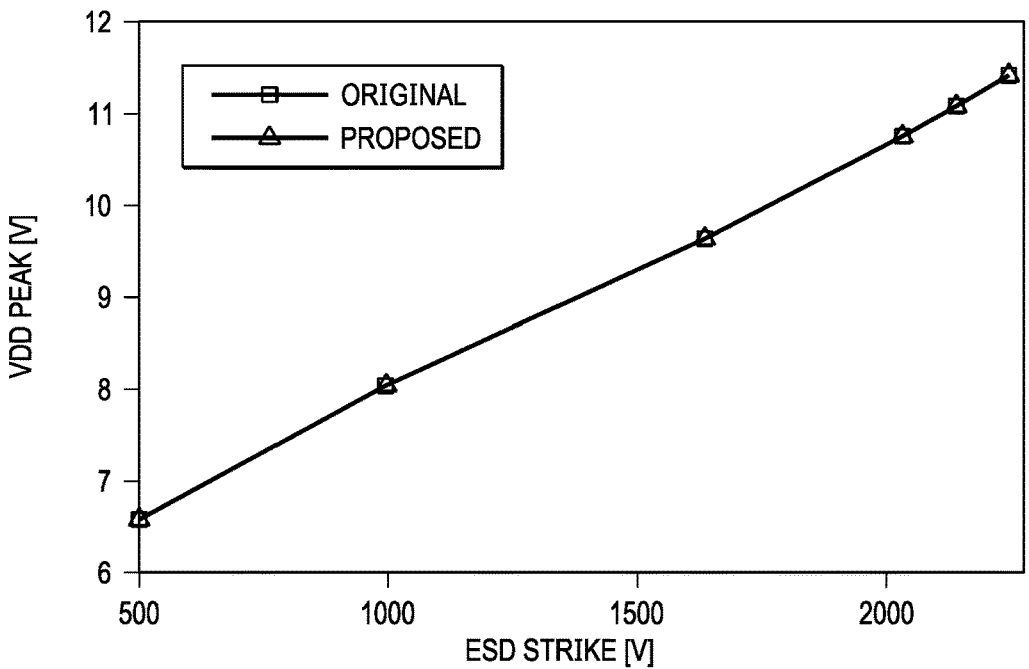
FIG. 5b is a graph of peak clamping voltages at a protected pin of an ESD protection circuit, for various ESD protection circuit topologies including the rate-triggered ESD protection circuit of FIG. 4, and as a function of ESD event voltage, in an example.

FIG. 5b is a graph 550 of peak clamping voltages at a protected pin of an ESD protection circuit (e.g., VDD), as a function of ESD event or strike voltage. The graph 550 includes a first plot labeled "original," which is for the first ESD protection circuit topology described above. The graph 550 includes a second plot labeled "proposed," which is for the second ESD protection circuit topology described above. The graph 550 demonstrates that the examples of this description, which include the level-sensing circuit 402, provide similar performance (e.g., clamping voltage at VDD) responsive to various ESD strike voltages when compared to ESD protection circuits that do not include such level-sensing circuit 402. Accordingly, the examples described herein that include the level-sensing circuit 402 provide similar protection against ESD events as compared to ESD protection circuits 102 without the level-sensing circuit 402.

Figure 6A:
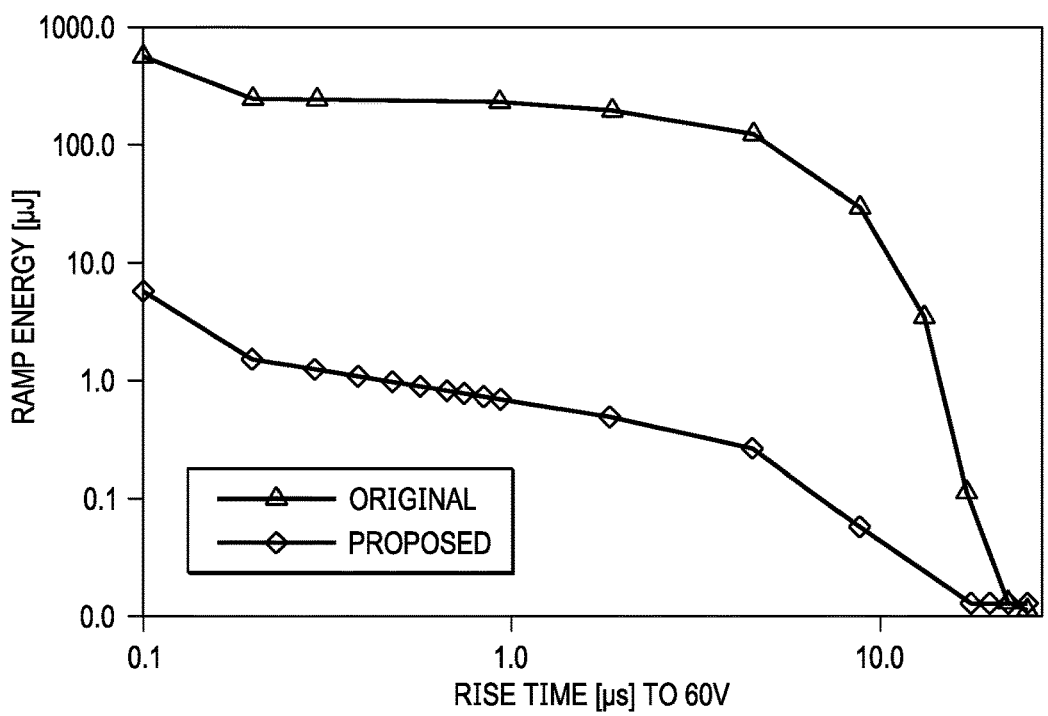
FIG. 6a is a logarithmic graph of energies dissipated by a power transistor of an ESD protection circuit, for various ESD protection circuit topologies including the rate-triggered ESD protection circuit of FIG. 4, and as a function of hot plug-in (HP) event rise time, in an example.

FIG. 6a is a logarithmic graph 600 of energies dissipated by a power transistor of an ESD protection circuit, such as the power transistor 212 described above, as a function of HP event rise time. The graph 600 includes a first plot labeled "original," which is for the first ESD protection circuit topology described above. The graph 600 includes a second plot labeled "proposed," which is for the second ESD protection circuit topology described above. The graph 600 demonstrates that the examples of this description, which include the level-sensing circuit 402, provide improved performance (e.g., reduced energy dissipated by the power transistor 212) responsive to various HP event rise times. For example, for certain HP event rise times, the energy dissipated by the power transistor 212 is reduced by approximately two orders of magnitude relative to ESD protection circuits 102 without the level-sensing circuit 402 described above. Accordingly, the examples described herein that include the level-sensing circuit 402 provide improved performance responsive to HP events as compared to ESD protection circuits 102 without the level-sensing circuit 402.

Figure 6B:
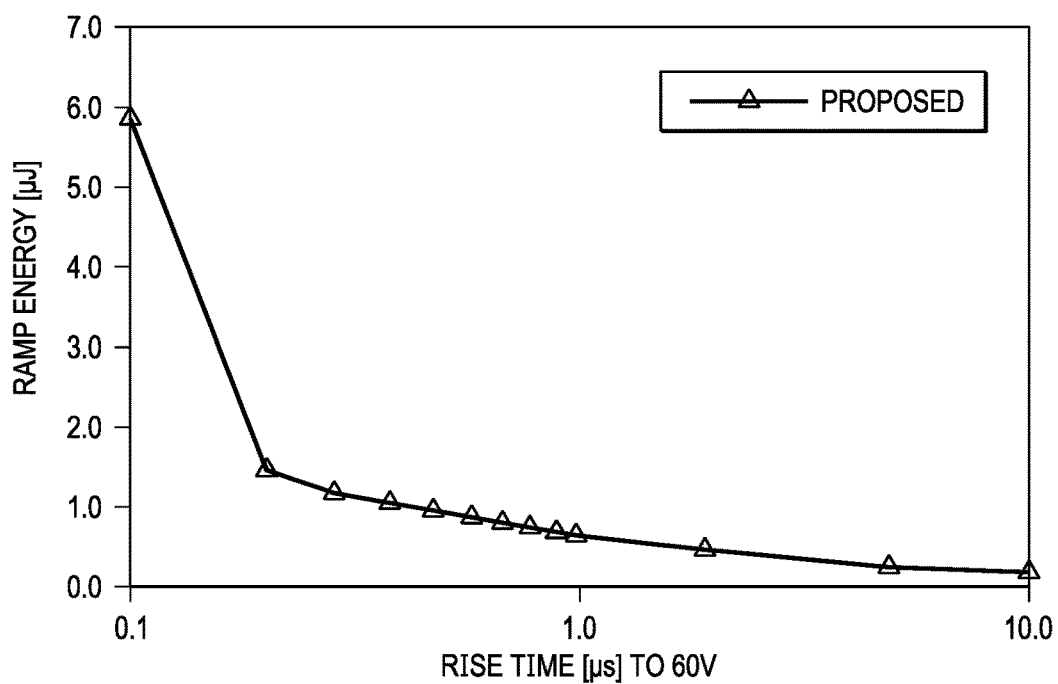
FIG. 6b is a graph of energies dissipated by a power transistor of the rate-triggered ESD protection circuit of FIG. 4 as a function of HP event rise time, in an example.

FIG. 6b is a graph 650 of energies dissipated by the power transistor 212 as a function of HP event rise time, in an example. The graph 650 includes the "proposed" plot of the graph 600, but with a linear y-axis scale. Accordingly, the graph 650 provides another indication of the extent to which the level-sensing circuit 402 reduces the ramp energy, or energy dissipated by the power transistor 212, during an HP event.

Figure 7:
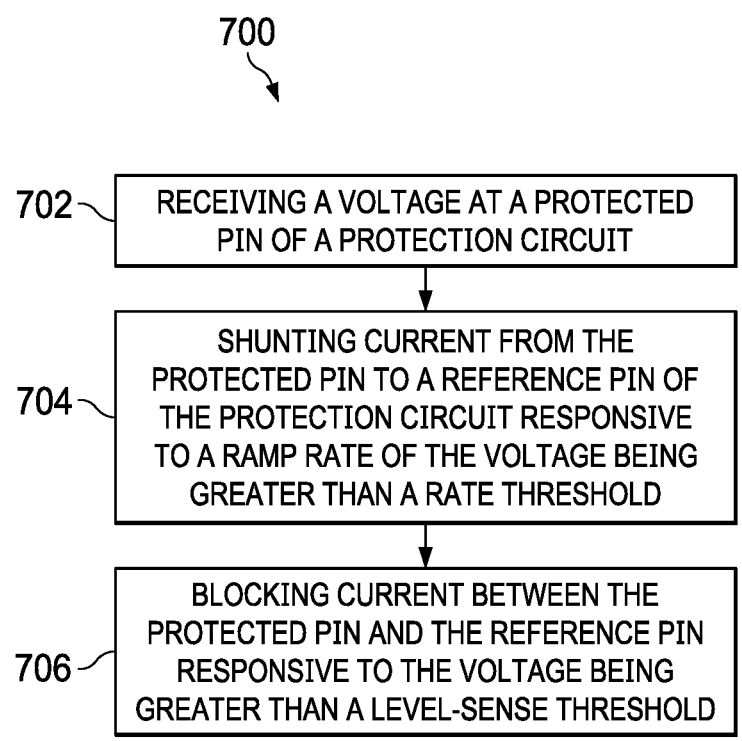
FIG. 7 is a flow chart of a method of operation of the rate-triggered ESD protection circuit of FIG. 4 in an example.

FIG. 7 is a flow chart of a method 700 of operation of the ESD protection circuit 102, including the level-sensing circuit 402, in an example. The method 700 begins in block 702 with receiving a voltage at a protected pin of a protection circuit. For example, ESD protection circuits 102 are rate-triggered, in which the ESD protection circuit 102 turns on to shunt current from the protected pin VDD to the reference pin GND responsive to an input voltage signal received at the protected pin VDD.

The method 700 continues in block 704 with shunting current from the protected pin to a reference pin of the protection circuit responsive to a ramp rate of the voltage being greater than a rate threshold. For example, the rate-triggered ESD protection circuit 102 is configured to turn on (e.g., shunt current from the protected pin VDD to the reference pin GND) responsive to a voltage received at the protected pin having a ramp rate greater than a rate threshold of the ESD protection circuit 102.

The method 700 continues in block 706 with blocking current between the protected pin and the reference pin responsive to the voltage being greater than a level-sense threshold. For example, the rate-triggered ESD protection circuit 102 is also configured to turn off responsive to the voltage received at the protected pin exceeding a level-sense threshold, as detected by the level-sensing circuit 402. The level-sense threshold is greater than the first voltage level (e.g., the expected voltage responsive to an ESD event). The level-sense threshold is also less than the second voltage level (e.g., the expected voltage responsive to an HP event).

Accordingly, the rate-triggered ESD protection circuit 102 of this description is triggered responsive to an ESD event, but also turns off responsive to an HP event (e.g., responsive to the level-sensing circuit 402), and thus avoids false triggering responsive to an HP event. The internal components of the described rate-triggered ESD protection circuit 102 are thus protected from damage responsive to the HP event.

The term "couple" is used throughout this description. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" or "ground voltage" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A device, comprising:
   a protected terminal;
   a reference terminal;
   a rate-triggered circuit coupled to the protected terminal and to the reference terminal, the rate-triggered circuit configured to provide an output voltage responsive to a ramp rate of a voltage at the protected terminal being greater than a rate threshold;
   a transistor configured to shunt current from the protected terminal to the reference terminal responsive to the rate-triggered circuit output voltage; and
   a level-sensing circuit configured to turn off the transistor responsive to the voltage at the protected terminal being greater than a level-sense threshold, wherein:
      an expected voltage at the protected terminal responsive to an electrostatic discharge (ESD) event is a first voltage value;
      an expected voltage at the protected terminal responsive to a hot plug-in (HP) event is a second voltage value, wherein the second voltage value is greater than the first voltage value; and
      the level-sense threshold is greater than the first voltage value and less than the second voltage value.

2. The device of claim 1, wherein the ramp rate of the voltage at the protected terminal responsive to the ESD event is greater than the rate threshold.

3. The device of claim 1, wherein the ramp rate of the voltage at the protected terminal responsive to the HP event is greater than the rate threshold.

4. The device of claim 1, wherein the protected terminal is adapted to be coupled to a voltage supply terminal of an integrated circuit.

5. The device of claim 1, wherein the transistor is a first transistor, and wherein the level-sensing circuit includes:
   a second transistor configured to turn off the first transistor responsive to the second transistor being on; and
   a resistive voltage divider configured to turn the second transistor on responsive to the voltage at the protected terminal being greater than the level-sense threshold.

6. The device of claim 5, wherein the level-sensing circuit includes a Zener diode coupled in series with the resistive voltage divider.

7. A method, comprising:
   receiving a voltage at a protected terminal of a protection circuit;
   shunting current from the protected terminal to a reference terminal of the protection circuit responsive to a ramp rate of the voltage being greater than a rate threshold; and
   blocking current between the protected terminal and the reference terminal responsive to the voltage being greater than a level-sense threshold, wherein:
      an expected voltage at the protected terminal responsive to an electrostatic discharge (ESD) event is a first voltage value;
      an expected voltage at the protected terminal responsive to a hot plug-in (HP) event is a second voltage value, wherein the second voltage value is greater than the first voltage value; and
      the level-sense threshold is greater than the first voltage value and less than the second voltage value.

8. The method of claim 7, wherein the ramp rate of the voltage at the protected terminal responsive to the ESD event is greater than the rate threshold.

9. The method of claim 7, wherein the ramp rate of the voltage at the protected terminal responsive to the HP event is greater than the rate threshold.

10. The method of claim 7, comprising coupling the protected terminal to a voltage supply terminal of an integrated circuit.

11. A device, comprising:
    a protected terminal;

a reference terminal;

a rate-triggered circuit having an output, and an input coupled to the protected terminal;

a first transistor having a first terminal, a second terminal, and a control terminal, the first transistor first terminal coupled to the protected terminal, the first transistor second terminal coupled to the reference terminal, and the first transistor control terminal coupled to the rate-triggered circuit output;

a second transistor having a first terminal, a second terminal, and a control terminal, the second transistor first terminal coupled to the first transistor control terminal, and the second transistor second terminal coupled to the reference terminal;

a first resistor having a first terminal and a second terminal, the first resistor first terminal coupled to the protected terminal, and the first resistor second terminal coupled to the second transistor control terminal; and a second resistor having a first terminal and a second terminal, the second resistor first terminal coupled to the second transistor control terminal, and the second resistor second terminal coupled to the reference terminal, wherein:

an expected voltage at the protected terminal responsive to an electrostatic discharge (ESD) event is a first voltage value;

an expected voltage at the protected terminal responsive to a hot plug-in (HP) event is a second voltage value, wherein the second voltage value is greater than the first voltage value; and the second transistor is configured to turn on responsive to the voltage at the protected terminal being greater than a level-sense threshold, which is greater than the first voltage value and less than the second voltage value.

12. The device of claim 11, wherein the rate-triggered circuit includes:

a third transistor having a first terminal, a second terminal, and a control terminal, the third transistor first terminal coupled to the protected terminal, the third transistor second terminal coupled to the rate-triggered circuit output;

a capacitor having a first terminal and a second terminal, the capacitor first terminal coupled to the rate-triggered circuit input, and the capacitor second terminal coupled to the third transistor control terminal; and a third resistor having a first terminal and a second terminal, the third resistor first terminal coupled to the third transistor control terminal, and the third resistor second terminal coupled to the reference terminal.

13. The device of claim 11, wherein the rate-triggered circuit includes:

a third transistor having a first terminal, a second terminal, and a control terminal, the third transistor first terminal coupled to the protected terminal, the third transistor second terminal coupled to the rate-triggered circuit output;

a third resistor having a first terminal and a second terminal, the third resistor first terminal coupled to the rate-triggered circuit input, and the third resistor second terminal coupled to the third transistor control terminal; and a capacitor having a first terminal and a second terminal, the capacitor first terminal coupled to the third transistor control terminal, and the capacitor second terminal coupled to the reference terminal.

14. The device of claim 11, comprising a Zener diode having a first terminal and a second terminal, the Zener diode first terminal coupled to the first resistor second terminal, and the Zener diode second terminal coupled to the second transistor control terminal.

15. The device of claim 11, comprising a Zener diode having a first terminal and a second terminal, the Zener diode first terminal coupled to the second resistor first terminal, and the Zener diode second terminal coupled to the second resistor second terminal.

16. The device of claim 11, wherein a ramp rate of the voltage at the protected terminal responsive to the ESD event is greater than a rate threshold.

17. The device of claim 11, wherein a ramp rate of the voltage at the protected terminal responsive to the HP event is greater than a rate threshold.

* * * * *